US012571927B2

(12) United States Patent
Gottlob et al.

(10) Patent No.: US 12,571,927 B2
(45) Date of Patent: Mar. 10, 2026

(54) RADIATION SENSOR AND MANUFACTURING METHOD FOR SAME

(71) Applicant: VISHAY SEMICONDUCTOR GMBH, Heilbronn (DE)

(72) Inventors: Heinrich Gottlob, Nordheim (DE); Manuel Schmidt, Waghäusel (DE); Christoph Gebauer, Heilbronn (DE)

(73) Assignee: Vishay Semiconductor GmbH, Heilbronn (DE)

( * ) Notice: Subject to any disclaimer, the term of this patent is extended or adjusted under 35 U.S.C. 154(b) by 851 days.

(21) Appl. No.: 17/298,210

(22) PCT Filed: Nov. 29, 2019

(86) PCT No.: PCT/EP2019/083055
§ 371 (c)(1),
(2) Date: May 28, 2021

(87) PCT Pub. No.: WO2020/109536
PCT Pub. Date: Jun. 4, 2020

(65) Prior Publication Data
US 2022/0128717 A1 Apr. 28, 2022

(30) Foreign Application Priority Data

Nov. 30, 2018 (DE) ..................... 10 2018 130 510.9

(51) Int. Cl.
*G01T 1/24* (2006.01)
*H10F 30/22* (2025.01)
*H10F 77/50* (2025.01)
(52) U.S. Cl.
CPC ............. *G01T 1/244* (2013.01); *H10F 30/22* (2025.01); *H10F 77/50* (2025.01)

(58) Field of Classification Search
None
See application file for complete search history.

(56) References Cited

U.S. PATENT DOCUMENTS

| | | | | |
|---|---|---|---|---|
| 5,962,810 A | * | 10/1999 | Glenn | ................. H01L 31/0203 174/532 |
| 6,399,418 B1 | * | 6/2002 | Glenn | ............... H01L 23/49816 257/E31.127 |

(Continued)

FOREIGN PATENT DOCUMENTS

| | | |
|---|---|---|
| CN | 102859729 A | 1/2013 |
| CN | 103608922 A | 2/2014 |

(Continued)

OTHER PUBLICATIONS

"Fully Integrated Proximity and Ambient Light Sensor with Infrared Emitter, I2C Interface, and Interrupt Function (with multiple slave addresses)," VCNL4030X01—Vishay Semiconductors, www.vishay. com, Aug. 16, 2018, (20 pages).

(Continued)

*Primary Examiner* — Sarah K Salerno
(74) *Attorney, Agent, or Firm* — Volpe Koenig

(57) ABSTRACT

A radiation sensor has a substrate, a radiation sensitive chip thereon, a radiation impermeable frame joined to the chip side surfaces and surrounding the chip, and a radiation permeable layer over the chip. The frame does not project or does not substantially project over the upper edge of the chip along a substantial part of its inner periphery. The radiation permeable layer value projects over the chip in the lateral direction and is on the frame or above it.

12 Claims, 6 Drawing Sheets

(56) References Cited

U.S. PATENT DOCUMENTS

| | | | |
|---|---|---|---|
| 10,215,937 B1 | 2/2019 | Wu et al. | |
| 11,177,300 B2 | 11/2021 | Seki et al. | |
| 2003/0063445 A1 | 4/2003 | Fischbach et al. | |
| 2003/0146384 A1 | 8/2003 | Logsdon | |
| 2006/0153334 A1 | 7/2006 | Monin | |
| 2007/0023608 A1* | 2/2007 | Webster | H01L 27/14618 |
| | | | 257/E31.117 |
| 2008/0185610 A1 | 8/2008 | Kushimatsu et al. | |
| 2009/0097139 A1 | 4/2009 | Minamio et al. | |
| 2009/0267170 A1* | 10/2009 | Chien | H01L 27/14618 |
| | | | 257/434 |
| 2014/0203380 A1 | 7/2014 | Theuss | |
| 2015/0001707 A1 | 1/2015 | Do et al. | |
| 2016/0011111 A1 | 1/2016 | Stoll et al. | |
| 2016/0146639 A1* | 5/2016 | Chan | H03K 17/945 |
| | | | 29/428 |
| 2020/0129104 A1 | 4/2020 | Haiberger | |
| 2020/0350351 A1* | 11/2020 | Yoo | H10F 39/8067 |

FOREIGN PATENT DOCUMENTS

| | | | |
|---|---|---|---|
| CN | 105531829 A | 4/2016 | |
| CN | 108474753 A | 8/2018 | |
| CN | 207938641 U | 10/2018 | |
| DE | 20306928 U1 | 6/2004 | |
| DE | 102008021108 A1 | 11/2009 | |
| DE | 102014100743 A1 | 7/2014 | |
| DE | 102014113844 A1 | 3/2016 | |
| DE | 102015116263 A1 | 3/2017 | |
| DE | 102017110216 A1 | 11/2018 | |
| EP | 1136936 A1 | 9/2001 | |
| EP | 2384426 A1 | 11/2011 | |
| JP | H05145089 A | 6/1993 | |
| JP | H7-22630 A | 1/1995 | |
| JP | 2001-50814 A | 2/2001 | |
| JP | 2008192769 A | 8/2008 | |
| JP | 2011-009789 A | 1/2011 | |
| JP | 2013098321 A | 5/2013 | |
| JP | 2013-235887 A | 11/2013 | |
| JP | 2018-014462 A | 1/2018 | |
| KR | 20100060681 | 6/2010 | |
| KR | 20140070632 A | 6/2014 | |
| TW | 201600834 A | 1/2016 | |
| WO | 2006095834 A1 | 9/2006 | |
| WO | 2010065749 A1 | 6/2010 | |
| WO | 2013065729 A1 | 5/2013 | |
| WO | 2013168442 A1 | 11/2013 | |
| WO | WO-2019172841 A1 * | 9/2019 | G02B 6/4249 |

OTHER PUBLICATIONS

"Silicon PIN Photodiode," VEMD5510C—Vishay Semiconductors, www.vishay.com, Jun. 22, 2017, (7 pages).

* cited by examiner

<u>Fig.1</u>
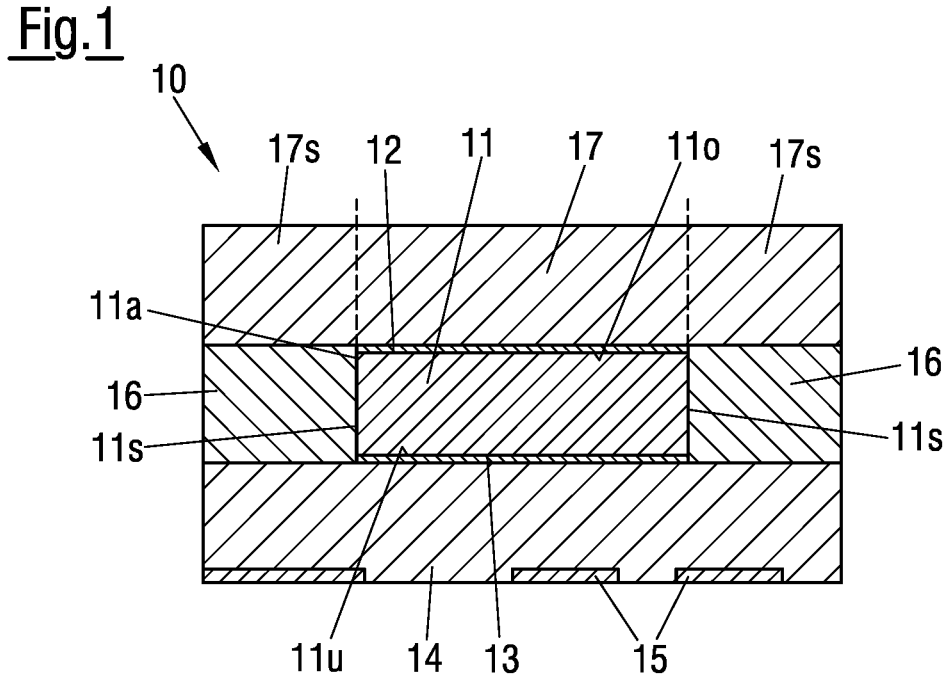
<u>Fig.2</u>
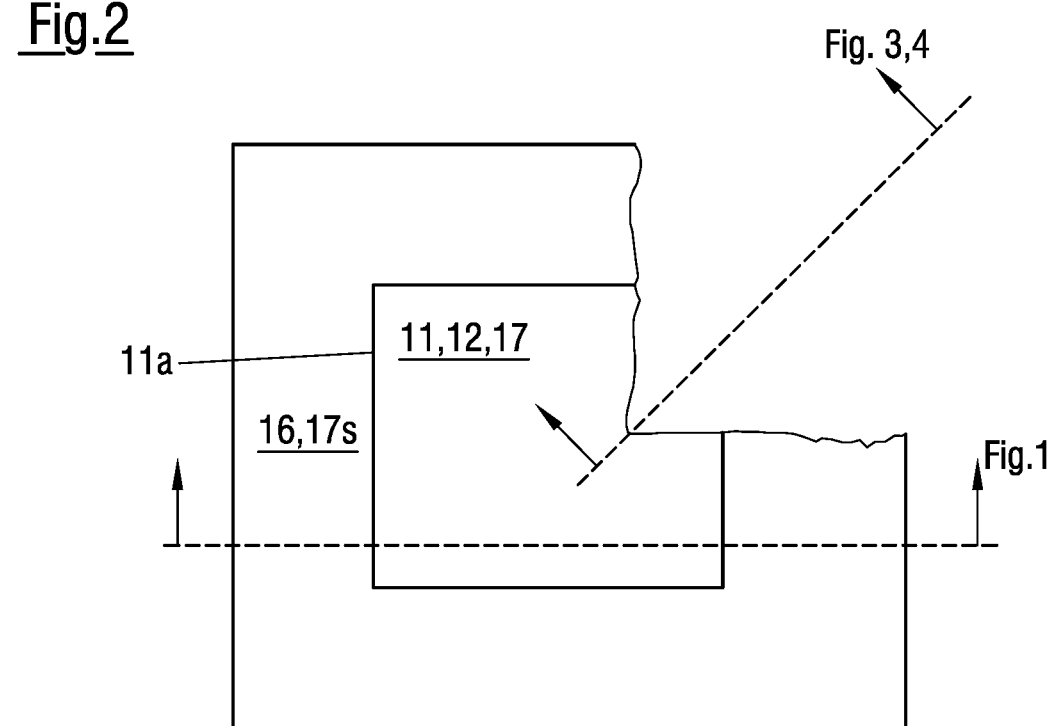

<u>Fig.3a</u>
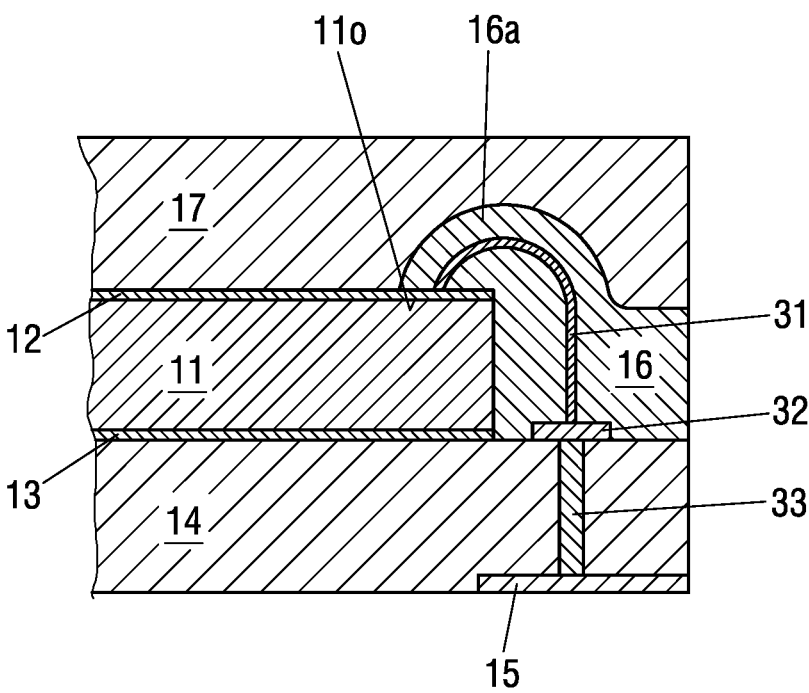
<u>Fig.3b</u>
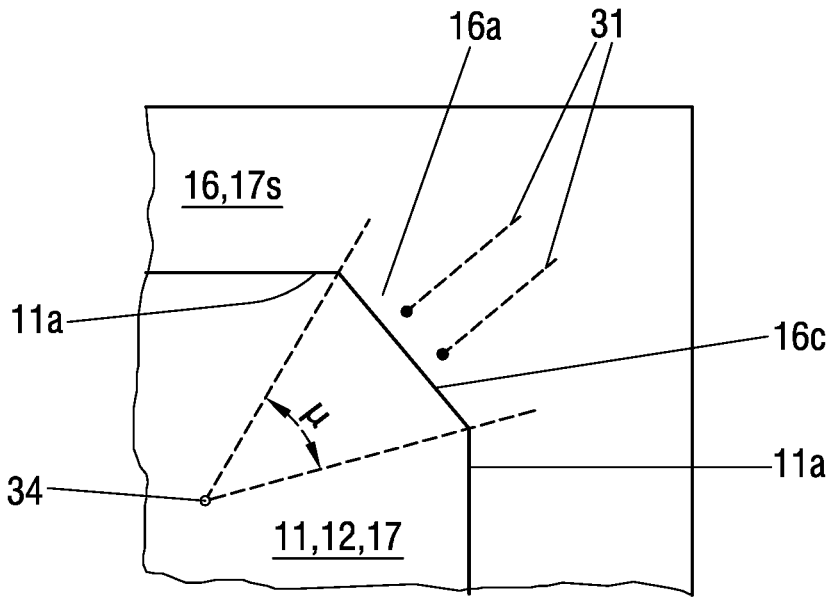

<u>Fig.7</u>
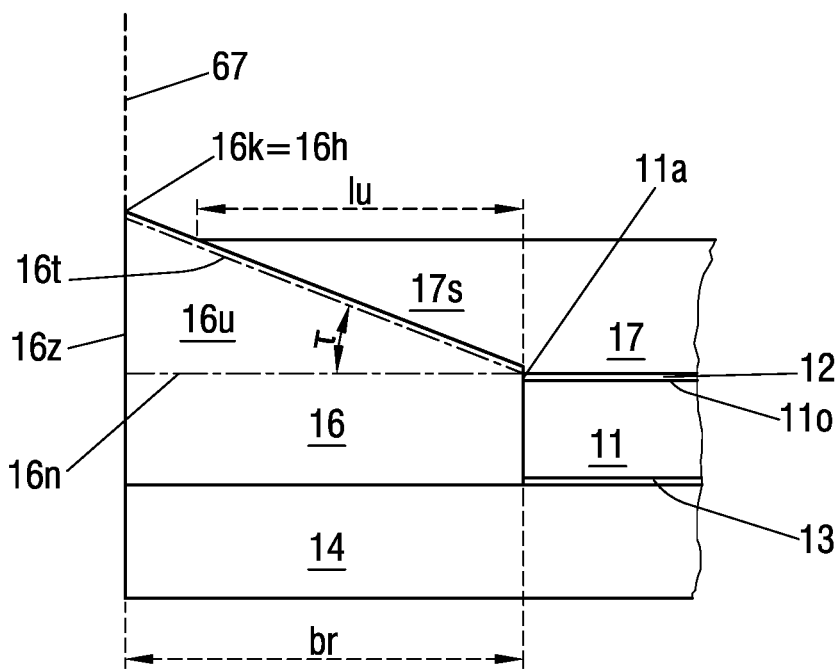

RADIATION SENSOR AND MANUFACTURING METHOD FOR SAME

CROSS-REFERENCE TO RELATED APPLICATIONS

This application is a 371 national phase application of International Application No. PCT/EP2019/083055, filed Nov. 29, 2019, which claims priority to German Patent Application No. 102018130510.9, filed Nov. 30, 2018, which are both incorporated by reference as if fully set forth herein.

FIELD OF INVENTION

The present invention relates to a radiation sensor and to a manufacturing method for same.

BACKGROUND

Modern radiation sensors have to satisfy different boundary conditions. On the one hand, they have to be sufficiently small so that they can be integrated into equipment and structures that is/are in turn small. Furthermore, they should have easily selectable spectral characteristics in their response behavior with respect to radiation so that they, for example, either specifically select or directly exclude specific wavelength ranges in the visible range of the spectrum (400 nm to 800 nm) or in the infrared range (wavelength >800 nm) or in the ultraviolet range (wavelength <400 nm) for the generation of electrical signals according to incident radiation. Care must furthermore be taken that the wiring of the sensors is also permanently durable when the radiation sensor is to be used in mechanically demanding environments with pronounced vibrations and shocks or in thermally demanding environments with a large number of and/or large temperature cycles. The radiation sensors of the kind under consideration here can, for example, be photodiodes or phototransistors that are sensitive in a visible spectral range and/or in the infrared.

Radiation sensors as a rule have radiation sensitive chips that generate an electrical signal according to incident radiation. The wavelength selectivity can be established in that a filter layer is applied to the chip upper surface that has the desired radiation selectivity in the transmission or blocking of wavelength ranges. Such a filter layer is typically relatively thin in comparison with the chip. Such filters are as a rule applied over a large area on large-area chip structures that are separated after the application of the filter layer. In this manner, filter layers cover the upper surfaces, but not the side surfaces of the chips that are themselves sensitive to radiation so that the side surfaces can compromise the radiation selectivity of the chip upper surface if radiation of any kind is incident on the side surfaces of the chip.

Furthermore, as chip upper surfaces become smaller and smaller, the incident convertible radiation power becomes smaller and smaller proportionally thereto. Limits to the radiation collection and radiation conversion due to the design therefore have to be avoided.

Known radiation sensor constructions are shown in FIGS. 8a to 8c.

FIG. 8a shows a construction using a metal mold. It has the disadvantage that the side walls of the chip are exposed so that a color filter applied to the upper surface of the chip is bypassed.

FIG. 8b shows a sensor chip having a preshaped conductor structure and frame structure such as known in a similar manner from DE 10 2015 116 263 A1. The frame surrounds the sensor chip at a distance and projects over it for a later filling of a transparent casting compound. This construction also does not sufficiently cover the side walls. The frame projecting over the chip upper surface results in shading of the incident radiation on an oblique incidence and thus in a sensitivity reduction.

FIG. 8c shows a construction in which a frame is laterally molded to the sensor chip using the FAM (film assisted molding) technique. The frame projects over the upper surface of the chip for the later filling of material of a further transparent layer. Marginal regions of the chip surface can also be regionally covered by the frame material. The coverings reduce the sensor sensitivity independently of the radiation angle. The high margin has the result of shading, as already in the embodiment shown in FIG. 8b, at least on an oblique incidence of radiation. Sensitivity is therefore also limited in this embodiment.

DE 10 2014 100 743 A1 describes a film assisted molding process in component manufacture.

SUMMARY

It is the object of the invention to provide a radiation sensor that has an easily settable wavelength selectivity with simultaneously good sensitivity with a small construction. A manufacturing method for such a sensor should also be provided.

The above object is satisfied by the features disclosed herein.

A radiation sensor is disclosed herein. The radiation sensor comprises a substrate, a radiation sensitive chip (directly or indirectly) thereon, and a radiation impermeable frame joined to the chip side surfaces and surrounding the chip. A radiation permeable layer is applied over the chip or (where present) over a filter layer located on the upper surface of the chip. The frame does not project or only negligibly projects over a substantial part of the inner periphery of the chip at the upper edge of the chip. The radiation permeable layer extends in a lateral direction beyond the chip and thus over the frame and can lie on it or above it.

The term "lateral" means an extent in parallel with the substrate surface. "Vertical" in contrast means a direction perpendicular to the substrate surface.

The radiation impermeable frame can laterally surround the chip and can in particular contact the side surfaces of the chip over the total height of the chip. The radiation impermeable frame does not project or does not substantially project over the upper edge of the chip or over the plane of the upper surface of the chip along a substantial part of the inner periphery of the frame, in particular in a vertical direction, and the frame also does not cover the upper surface of the chip in a lateral direction along this part of the inner periphery of the frame. This does not, however, have to apply to the total inner periphery of the frame, in particular with regard to a possible embedding of one or more bond wires in the frame, as will be explained in the following. The radiation impermeable frame can in particular also be configured such that it is positioned not lower than or not substantially lower than the upper edge of the chip.

The "inner periphery" of the frame can in particular be understood as the periphery of the frame along the side surfaces of the chip. Said "substantial part" of the inner periphery of the frame can be defined as a path section at the total inner periphery of the frame and can be at least 30% or at least 50% or at least 70% or at least 80% of this periphery. For technical production reasons, the intentional and/or unintentional result can be that the frame projects more than insubstantially over the frame edge at a plurality of points that are not contiguous viewed over the periphery. The regions of the frame edge not substantially projected over are then also not contiguous viewed over the periphery. The above-named dimensions then relate to the sum of the lengths of the individual regions.

The attachment of the radiation impermeable frame to the sensor chip such that the frame contacts the lateral surface of the sensor chip has the effect that the lateral surface is covered and thus does not act as radiation converting. A filter layer provided on the sensor upper surface can therefore not be bypassed by radiation. Since the frame does not substantially project over the chip upper surface, shading structures or structures directly covering the sensor chip upper surface are furthermore thereby not provided or are only provided to a small extent so that sensitivity impairments are also reduced to this extent.

Furthermore, the radiation permeable layer laterally projecting over the chip has the result that more radiation can be conducted through it from outside the chip upper surface toward the chip upper surface, in particular by scattering, multiple scattering, reflection, and multiple reflection, so that an increase in sensitivity is present by this effect.

The described construction thus combines structural features that, on the one hand, avoid or reduce sensitivity reducing structures and that, on the other hand, take up sensitivity increasing structures. In this manner, a radiation sensor is provided overall that also has good sensitivity with good wavelength selectivity.

The radiation sensitive chips are typically connected to other electrical or electronic structures, as a rule to conductor tracks on the carrier or substrate or board or conductor frame or lead frame, by one or more bond connections. One focus of the invention is also on the protection of these bond connections. In general, two possibilities are conceivable for this, that is, on the one hand, the casting of the bond connections into the material of the frame or the casting of the bond connections into the material of the radiation permeable layer.

The bond wires that contact the chip typically engage at the upper surface of the radiation sensitive chip and are then led out at least laterally, as a rule then also downwardly onto a metal target surface on the board or substrate or lead frame. It can in turn be further connected, for instance connected through to freely accessible contact surfaces on the other side of the substrate so that an SMD (surface mounted device) component is produced.

A possibility of protecting the bond wires is to attach them before production of the frame and then to cast the bond wires into the frame material on the production of the frame such that bond paths that are laterally disposed next to the chip and run downwardly to the carrier/substrate are cast into the anyway present material of the initially described frame, but also to carry out the shaping such that the regions of the bond wire or wires disposed above the chip are cast into parts of the frame material that partly project over the chip. The frame material, that is not itself transparent, will then cover specific regions of the upper surface of the chip. In such an embodiment, one or more contiguous such parts of the frame material can be provided that project over the upper surface of the chip in the vertical direction and cover it in a lateral direction.

The frame material can be easily adapted in its thermal coefficients of expansion to the thermal coefficients of expansion of the bond material or of other components, in particular of the substrate, so that this construction is particularly to be provided when the radiation sensor can be used in temperature critical applications if, for example, high temperature differences are possibly run through fast and perhaps also fast. This can be the case in automobile manufacturing.

Another possibility of protecting the bond wires is to embed them in the material of the radiation permeable layer. In this construction, the frame is produced around the chip before the establishing of the bond connections, and indeed such that it has a recess laterally next to the chip that extends down to the target surface of the bond connections. After production of the frames designed in this manner, the bond connection can then be led from the chip upper surface through the recess onto the substrate surface. The already mentioned radiation permeable layer is then applied to the chip upper surface and to the frame next to the chip upper surface. It also covers the bond connections in so doing. It can also run into the opening in the frame and can then also cast the bond wires in the opening and protect them.

The design of the bond wires and of the radiation permeable layer is such in this embodiment that the latter also completely envelopes the bond wires on the chip upper surface. In this construction, no covering material at all is present on the chip upper surface so that good sensitivity results. The relationships with respect to thermal coefficients of expansion are such that they are fully sufficient for less temperature critical applications.

In the described embodiment, the sensor chip can ultimately have one, two, or more radiation permeable layers, in particular where possible a filter layer applied in the chip production directly on its upper surface; in addition, the mentioned radiation permeable layer that is applied on the sensor production and where possible one or more further layers. The radiation permeable layer has a protective function and also the described radiation collecting function from regions outside the chip upper surface. It can in turn also be designed as filtering or as wavelength selective and can then have a filtering effect in addition to the filter layer directly on the chip.

The wavelength selectivities of the filter layer and/or of the radiation permeable layer can be designed such that they block or transmit wavelengths or wavelength ranges in the IR range and/or in the visible range and/or in the UV range of the spectrum.

The material of the frame can be or comprise a thermoplastic or a thermosetting plastic and can be a material mixture. It is preferably an initially flowable or castable plastic that is then hardenable or comprises artificial resin. The material mixture can have a grainy or powdery filler, with the filler in particular having a thermal coefficient of expansion such that the frame material mixture in total has an adapted coefficient of expansion. Its coefficient of expansion a can be in the range between 30% and 200% of the coefficient of expansion of the material of a bond wire or of the substrate of the radiation sensor. The filler material can comprise glass grains or glass dust, silica, or ceramics, or similar.

The radiation impermeable frame should not project or should "not substantially" project over the upper edge of the chip, as mentioned above. The latter can in particular be present when the frame is not only joined to the side surfaces of the actual chip, but also to the side surfaces of a filter layer applied to the upper surface of the chip and therefore already projects over the upper surface of the actual chip in the vertical direction. The mentioned "not substantial" projection of the frame in particular designates, worded even more generally, a height of the frame at the chip margin or at the peripheral upper edge of the chip above the chip upper surface that can be at most 10% or at most 5% or at most 3% or at most 2% or at most 1% of the maximum extent of the chip in the direction in parallel with the substrate. The maximum extent can be a diagonal of an outline with a rectangular chip outline. It can be the diameter with a round outline. With respect to the dimensions of the projection of the frame material over the chip as described, the dimensions can refer directly to the upper surface of the chip or to the upper surface of the filter layer thereabove. The same considerations apply with respect to the lower position relative to the upper edge of the chip as described. Such positive or negative deviations can result due to manufacture, but are not intended, at least not directly at the peripheral upper edge of the chip.

The frame or regions of the frame can, however, project beyond the chip upper surface in the vertical direction laterally outside the upper edge of the chip and in particular laterally spaced apart from the chip. Such projecting regions can surround the chip in the manner of an annular wall so that a basin or a tub is provided into which the material of the radiation permeable layer can be poured in then still liquid form later in production and in which it can harden. The height of the wall above the chip upper surface can be small in comparison with its maximum extent. It can be above 3% or above 5% of the maximum extent and can be below 20% or below 15% or below 10% of the maximum extent. The design can be such that the highest point of the projecting regions is spaced apart from the chip edge by at least 10% or at least 20% of the maximum extend or is at the margin of the sensor element. The vertical projection of the frame can also be provided along the total periphery of the frame or only along a part of the periphery of the frame and can already start from the upper edge of the frame. The frame can here form a shallow funnel angle that can, for example, be below 30° or below 20° or below 15° or below 10° here. The projection can also only be formed laterally spaced apart from the upper edge of the chip and can in particular rise continuously starting with a certain lateral spacing from the chip. It is nevertheless ensured with such embodiments that shading of the incident radiation on oblique incidence and sensitivity reductions associated therewith are at least largely avoided.

The maximum extent of the chip in a direction in parallel with the substrate can be smaller than 6 mm or smaller than 4 mm or smaller than 2 mm.

The frame with all its structural features such as described above can be manufactured by a FAM (film assisted molding) process. The shaping for the casting of the frame essentially then takes place by a rigid, somewhat metallic negative mold. A film is furthermore provided that follows the surface of the mold. The film is also sucked through vacuum passages into concave cavities of the mold. The film has a sealing effect, on the one hand, in that it can lie on the sensor chip, for example, with a certain yield similar to a sealing ring and thus prevents the frame material from running onto the sensor upper surface during casting. This can practically not be done with rigid shapes since the chip material itself is brittle and it would splinter as a rule on powerful contact with the mold such as would be required for sealing. The film furthermore facilitates the release of the finished products from the mold after casting.

The substrate or carrier can be a prefabricated electrically insulating carrier or frame or lead frame that can already be provided with suitable conductor structures. Conductor structures can be provided on both main surfaces or can be embedded therein. They can be connected through the carrier material. On one side (the future outer side of the sensor), external electrical contacts of the component to be produced can be disposed; on the other side (the future inner side), internal wiring, for instance bond targets as bond pads for bond connections toward the chip, lines toward vias, and optionally further lines.

The sensor element can have further connection elements in addition to the radiation sensitive chip that are also arranged on the substrate or lead frame. They can be designed as an integrating circuit. They can be connected to the radiation sensitive chip and can, for example, serve for the processing and/or amplification and/or conversion, e.g. from analog to digital, of the signals from the chip. The further circuit elements can already be wired and can thus be part of the prefabricated substrate and can then also be cast into the frame material. Where required, the sensor element can then have two, three, four, or more external connectors, for instance on the lower substrate side to provide an SMD component, e.g. at least two for the signal that can e.g. be output as analog or digitally in series, optionally one or two further components for the power supply, and optionally further components for control signal inputs and outputs.

A method of manufacturing a radiation sensor, in particular of the above-explained type, comprises the steps: Attaching a radiation sensitive chip to a suitably prefabricated substrate; casting a frame onto the chip using a FAM (film assisted molding) process so that the frame contacts an outer periphery of the chip and does not project over or does not substantially project over or falls below the peripheral upper edge of the contour of the chip along a substantial part of the inner periphery of the frame; and attaching a radiation permeable layer above the chip and at least above regions of the frame to the side of the chip.

The filigree shaping of the frame in the region of the actual sensor chip and in the region of the bond wires or of covering structures for them or optionally of a passage for the bond wires becomes possible using the FAM process in the production of said frame.

Depending on the kind of desired cover of the bond wires, the bond connection of the chip to other structures can take place before the frame production or after the frame production, as described further above.

The manner of manufacture can be such that a plurality of chips are as a rule attached to a large and suitably prepared substrate or carrier in patterned form and are then further processed together on the contiguous substrate (frame production, bonding, application of the radiation permeable layer, . . . ), for instance as a field of, for example 10*20 initially contiguous sensor elements. A separation of the individual sensors by cutting up the structure produced in common only takes place last.

On a common production of a plurality or of a large number of radiation sensors on first one common substrate, the frames of all the radiation sensors can be produced as a common cast structure in that the liquid frame material is cast around the chips disposed "in an insular manner" in the initially liquid casting compound and, where possible, in the already bonded chips and casting where possible takes place over the further circuit elements provided the film assisted shape allows it. The separation (cutting up) of the sensors then takes place in regions of the hardened frame materials.

If a comparatively smooth surface is present after the casting of the frame material in a common production of a large number of radiation sensors, the material of the radiation permeable layer can be cast onto it so that it extends uniformly over all the sensor elements to be produced or is spread and uniformly covers the chips. It can then harden and then be cut up on separation.

If in contrast elevated portions are provided at the frame to the side of the chip surfaces in grid shape disposed between the individual sensor chips and fully surrounding them, the resulting basins can be individually filled over the individual sensor chips. The material then runs in each case within the respective basin and so hardens. The separation can take place by cutting along these elevated portions.

The radiation permeable layer can, however, also be manufactured in that the semifinished radiation sensor, in particular already provided with the frame, or the not yet separated contiguous large number of semifinished radiation sensors are added to a further mold after the shaping of the frame that serves the shaping of the radiation permeable layer as long as it is still liquid and in which the liquid material can harden.

BRIEF DESCRIPTION OF THE DRAWINGS

Embodiments of the invention will be described in the following with reference to the drawings. There are shown:

FIG. 1 a cross-section through a radiation sensor;

FIG. 2 a plan view of the radiation sensor;

FIGS. 3a and 3b a cross-section through and a plan view of the bonding region of the radiation sensor;

FIG. 7 features of the margin design; and

DETAILED DESCRIPTION

Figure 4A:
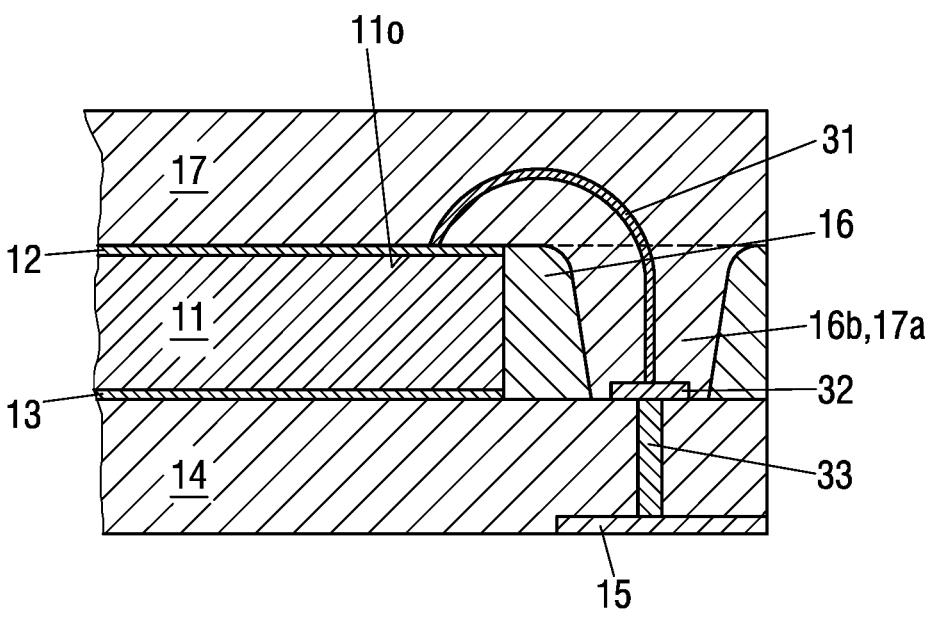
FIGS. 4a and 4b a further cross-section through and a plan view of the bonding region of the radiation sensor.

FIG. 1 shows a cross-section through a radiation sensor 10 beyond the side of the possibly present bond connections. The section is disposed as indicated in FIG. 2.

Numeral 14 designates a substrate. It can be a printed circuit board or a ceramic substrate, a conductor frame, e.g. a lead frame, or similar. The radiation sensitive sensor chip 11 is attached to the substrate 11, for instance in that it is adhesively bonded to the substrate 14 via an adhesive layer 13. An electrical contact with the substrate 14 can also be provided here. The chip 11 can furthermore also only be indirectly attached to the substrate 11, in particular via one or more intermediate elements or intermediate layers. The sensor chip can have two main surfaces $11u$ and $11o$. The lower main surface $11u$ faces the substrate 14; the adhesive bonding 13 can engage at it. The upper main surface $11o$ (chip upper surface) is the actual radiation collecting surface and is exposed to the incidence of radiation. However, a filter layer 12 that effects a desired wave selectivity can already be applied to it in the manufacture of the chip 11.

Numeral 15 designates metal contact surfaces that are accessible from external and can be soldered on from external. Beyond the plane of the section they can be connected through to electrical elements on the upper surface of the substrate 14. The sensor element can, as mentioned further above, have circuit elements, not shown, that can be connected to lines on or in the substrate 14 or through it to the chip 11 and/or to the contacts 15.

Numeral 16 designates the radiation impermeable frame that surrounds the chip 11. It is designed or produced such that it directly contacts the side surfaces $11s$ of the chip 11, in particular in that the frame 16 is molded onto the side surfaces $11s$ of the chip 11. The manufacture takes place such that at least in wide regions of the upper peripheral margin $11a$ (upper edge) of the chip 11, the frame 16 directly contacting this margin $11a$ does not project or does not substantially project over said margin $11a$, and is not or is not substantially lower, and also does not cover the chip upper surface $11o$ to obtain the effects described further above.

Depending on the kind of construction, this region of the upper peripheral margin $11a$ can be at least 30% or at least 50% or at least 70% or at least 75% or at least 80% of the length of the periphery of the upper surface $11o$ or of the upper peripheral margin $11a$ of the chip 11. It can also be 100% of the length, which will be explained further below.

The radiation permeable layer 17 is applied after production of the frame 16. It has regions $17s$ laterally beside the upper surface $11o$ of the chip 11. It can directly lie on the frame 16 here or can at least lie over it. These regions $17s$ have a function of scattering in radiation toward the upper surface $11o$ of the chip 11. The effect of scattering in radiation of the lateral regions $17s$ of the radiation permeable layer 17 is stronger than the scattering out effect of the regions of the layer 17 directly above the upper surface $11o$ of the chip 11. A gain in intensity and thus a gain in sensitivity of the sensor thereby results overall.

The outwardly disposed side walls of the substrate 14, of the frame 16, and of the radiation permeable layer 17 can be comparatively steep and can be aligned with one another. They can be created by a cutting up of a plurality of sensor structures produced together on the separation of the structures produced together by cutting up between the individual sensor chips 11.

FIG. 2 shows a plan view of an individual radiation sensor, with the region around possibly present bond connections being omitted. It is supplemented by FIGS. 3 and 4. The outer contour $11a$ of the chip 11 can be rectangular or quadratic. Other geometries are, however, also conceivable.

The frame 16 outwardly contacts the sensor chip 11 viewed in the radial direction. It thereby effects the desired covering so that a filter layer 12 possibly provided on the sensor chip 11 is not bypassed by laterally incident radiation. The radiation permeable layer 17 lies upwardly on the sensor chip 11 and on the frame 16. As already stated, the frame 16, the substrate 14, and the radiation permeable layer 17 can have a common outer contour that is produced by the cutting up on the separation of structures produced together. An individual production of radiation sensors is, however, also conceivable. The outer contours of the individual elements can then differ and can also be less steep than shown in FIG. 1.

FIG. 3a schematically shows a cross-section through an embodiment of the configuration of the bond region; FIG. 3b schematically shows the plan view of this region. In this embodiment, at least one bond wire 31 is generally provided. In the example shown, a bond wire 31 engages in an approximately parallel manner with at least one further bond wire at the upper surface $11o$ of the chip 11 and is then initially led out laterally and can then run downwardly, for instance to a bond pad 32 at a conductive track or similar. The bond wire 31 is completely embedded in the material of the frame 16. The bond wire 31 is produced before the manufacture of the frame 16. In the region of the bond wire 31 above the chip 11, the frame 16 has a cover 16a that is produced at the same time as it and that also covers a part region of the upper surface 11o of the chip 11 corresponding to the cover of the bond wire 31. In this embodiment, regions are therefore present in which the frame does noticeably project over the chip upper surface 11o and also covers it to be able to embed the bond wire 31, also above the chip upper surface 11o.

FIG. 3b shows by dashed lines the bond connections embedded in the opaque frame material. 16c is the edge of the cover 16a disposed above the chip upper surface 11o. The projection can, for example, as shown be designed as a cut-off corner of the contour of the chip 11. It can, however, also project in the manner of a finger from an edge or a corner of the chip upper surface 11o into the chip upper surface 11o.

Beyond the cover 16a, as otherwise required, the frame material at the chip edge 11a therefore remains substantially at the level of the upper surface 11o of the chip 11. The path portion can be the region of the chip edge not projected over or not substantially projected over, that is at least 30% or at least 50% or at least 70% or at least 75% or at least 80% of the total chip edge length over all the sides.

The cover 16a preferably takes up at most 40% or at most 30% or at most 20% or at most 15% or at most 10% of the upper surface 11o of the chip 11 so that the cover of the sensitive surface 11o of the chip 11 by frame material is small.

FIG. 3a also shows that the radiation permeable layer 17 also covers and lies on this region of the frame in the region of the cover 16a. The cover 16a can, however, also project upwardly from the radiation permeable layer 17.

The production of the cover 16a can take place by a uniform molding process together with the production of the frame 16 in that the negative mold has a suitable, optionally film assisted shape. In the region of the cover 16a, the negative mold has a concave structure that arches over the bond wires and that is then filled by the frame material on the filling in of the frame material. On a film assistance of the molding process, the film is sucked into the concave recess by vacuum formation so that a free space is produced in which the bond wires 31 come to rest before the actual molding and are then ultimately surrounded by the frame material of the cover 16a.

Figure 4B:
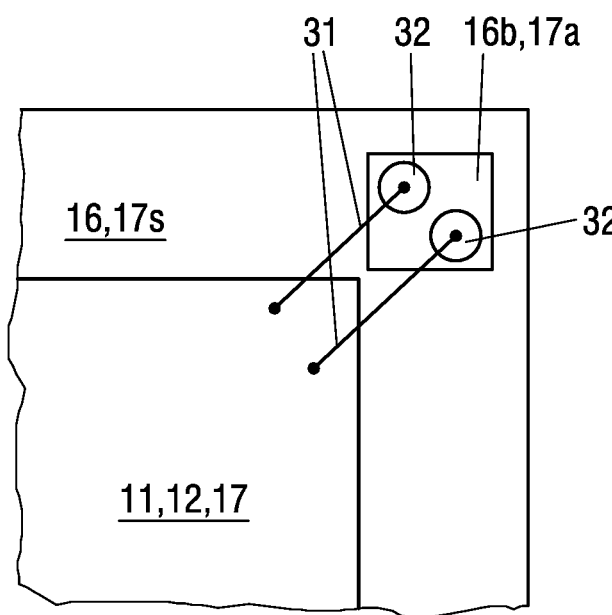

FIG. 4a shows an embodiment in which the bond wire 31 is molded, as a rule together with at least one further bond wire, into the material of the radiation permeable layer 17. For this purpose, the frame 16 was produced with a recess 16b that extends up to the target surface 32 of the bond connection 31. The frame production, including the production of the recess 16b, takes place before the manufacture of the bond connection 31. In the embodiment of FIGS. 4a and 4b, the chip margin is not projected over or is not substantially projected over by the frame 16 over 100% of the periphery.

The production of the recess 16b can take place by a uniform molding process together with the production of the frame 16 in that the negative mold has a suitable, optionally film assisted, shape. In the region of the recess 16b, the negative mold therefore has a convex, conical, or cylindrical structure that is then surrounded by the frame material on the filling in of the frame material. An opening 16b then remains in the frame through which the bond wires 31 are led to the bond pads 32. On the subsequent production of the layer 17, its material also flows into the opening 16b and envelops the bond wires 31 with this layer part 17a, as shown in FIG. 4b.

It must be pointed out that a chip 11 does not necessarily have to have a bond connection. It can also be suitably directly linked and connected at its lower side so that then the embodiments of FIGS. 3a, 3b, 4a, 4b would not be necessary and the corner region not shown in FIG. 2 would look like the corner regions shown. The electrical connection of the chip 11 can then take place from its lower side 11u.

FIGS. 3b and 4b show by way of example a via 33 by which, for example, a bond pad 32 can be connected to a contact 15. It is, however, also possible in a different embodiment to carry out the contacting of the radiation sensor from the outside by contact surfaces on the substrate surface. Corresponding areas to which then the conductor tracks 32 can also be soldered can then be kept free on the substrate during the molding of the frame.

Figure 5:
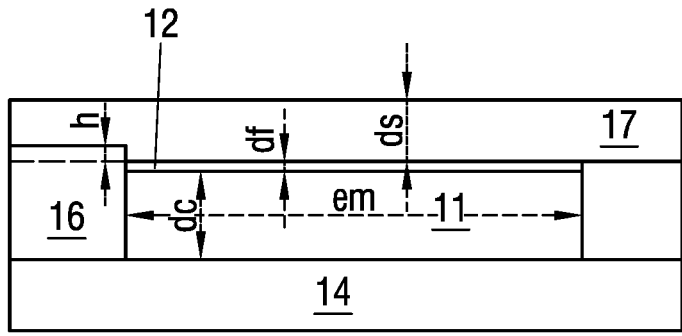
FIG. 5 a schematic representation for dimensioning.

FIG. 5 schematically shows dimensions. The dimension em is said maximum extent of the sensor chip 11. This diagonal can be from the bottom right to the top left in FIG. 2. It can be below 6 mm or below 4 mm or below 2 mm. The not substantial projection is marked by the height h. It can be at most 10% or at most 3% or at most 2% or at most 1% of the maximum extent em of the chip 11 in the direction in parallel with the substrate. The value dc is the chip thickness. It can be below 1 mm or below 500 μm or below 300 μm. The value df is the thickness of the filter layer 12. It can be below 50 μm or below 30 μm or below 20 μm. The value ds is the thickness of the radiation permeable layer 17. It can be below 1 mm or below 500 μm and can be above 50 μm or above 100 μm. The dimension lu of the lateral overhang 17s of the radiation permeable layer 17 beyond the upper surface 11o of the chip (cf. FIG. 7) can be bounded by the surface of the frame 16. It can, however, also be otherwise bounded. It can e.g. be at least one time or two times or three times the layer thickness ds of the radiation permeable layer or at least 100 μm or at least 200 μm or at least 500 μm or at least 1 mm. The minimum width of the frame br (cf. FIG. 7) in the lateral direction between the chip edge 11a and the outer contour of the frame 16z can in a plan view (e.g. FIG. 2) that can be the outer side of the total radiation sensor be above 50 μm or above 100 μm or above 200 μm or above 500 μm or above 1 mm or above 2 mm and/or can be below 5 mm or below 2 mm or below 1 mm. The width of the frame does not have to be uniform viewed over the periphery of the chip 11. It can be irregular.

The material of the frame 16 can comprise an initially moldable or flowable and then hardening plastic, for instance a thermosetting plastic material or a resin. Its coefficient of expansion a can be in the range between 30% and 200% of the coefficient of expansion of the material of a bond wire or of the substrate of the radiation sensor. The sensor chip 11 can comprise suitable treated semiconductor material, for instance silicon or similar, e.g. with differing doping amounts, doping profiles, and/or a differing pn transition. The filter layer 12 can be or comprise one or more interference filters or color filters or similar. The radiation permeable layer 17 can be a largely transparent layer or can have a suitably selected wavelength selectivity. It can be or comprise a hardening plastic or epoxy material. It can also be or comprise silicone.

Generally, the upper surface 11o of the sensor chip 11 can be completely or regionally radiation sensitive (i.e. converting the radiation into an electrical signal or contributing to radiation conversion in a layer disposed lower). The marginal region of the upper surface 11o, that is the part of the upper surface $11o$ extending along the upper peripheral margin $11a$ (upper edge) of the sensor chip $11$, can in particular also be completely peripherally or regionally radiation sensitive. The sensor chip $11$ has side surfaces $11s$ that can be regionally or completely peripherally radiation sensitive viewed over the periphery. The radiation sensitive region of the sensor chip $11$ can thus extend from the upper surface $11o$ of the sensor chip $11$ over the marginal region of the upper surface $11o$ up to the side surfaces $11s$ of the sensor chip $11$. Where radiation sensitive surfaces are addressed in the present disclosure, they can also be understood as material volumes that are disposed beneath the addressed surfaces.

The contact of the sensor chip $11$ can generally take place by means of connections (e.g. bond connections) from a single surface, e.g. the upper surface $11o$, of the chip. A via to its other surface can then be provided on the chip. The contact of the sensor chip $11$ can, however, also take place by connections of the two mutually oppositely disposed main surfaces $11o$ and $11u$ of which one can be a bond connection. Different contact patterns are also possible. Conversion characteristics of the chip can be set by doping parameters, optionally by layer thicknesses, possibly by doping profiles, by material selection, and/or by other parameters.

Figure 6:
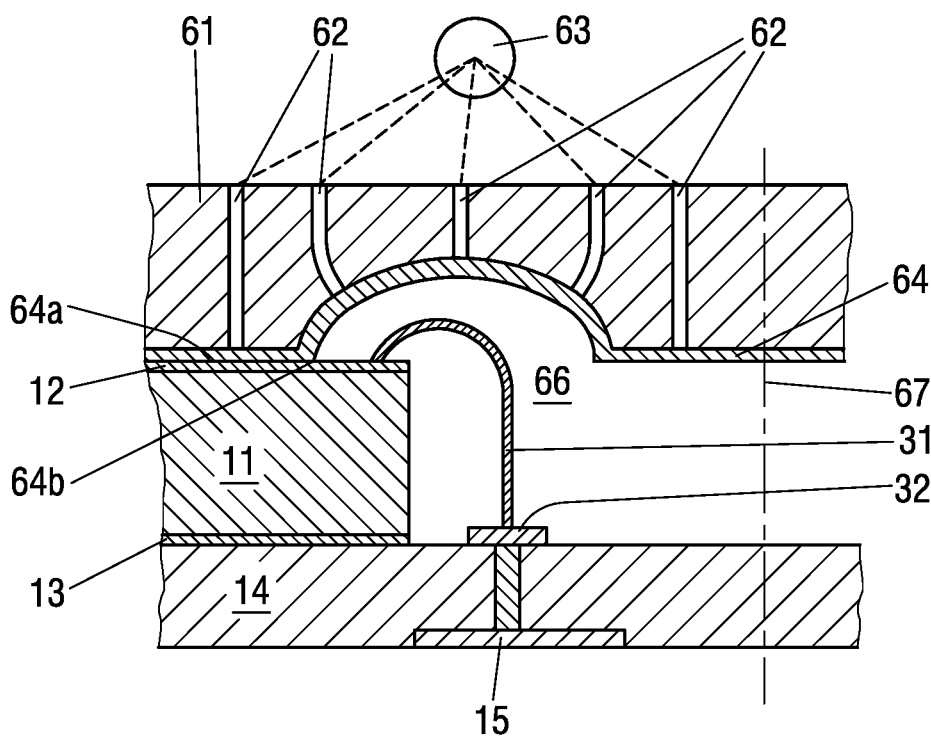
FIG. 6 a schematic representation for the explanation of the FAM process.
Figure 8A:
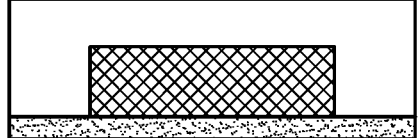
FIGS. 8a-8c representations of the prior art.
Figure 8B:
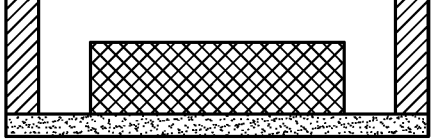
Figure 8C:
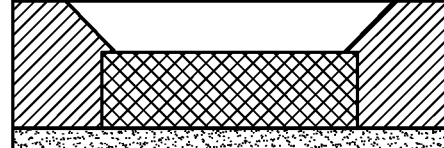

FIG. 6 shows in a highly schematic manner features of film assisted molding (FAM). A state is shown with a mold placed on before the molding of the frame. A rigid mold that is placed onto the partly finished sensor element $11$ to $17$ (without a frame $16$) is shown by $61$. A film $64$ that follows the lower surface $61a$ of the mold $61$ in tight contact is provided at its lower side facing the radiation sensor. Where concave regions exist, for instance to surround the bond wires $31$ at a distance, the film $65$ is sucked toward the surface $61a$ in that the volume is connected to a vacuum source $63$ via passages $62$. Air/gas is in this manner sucked out between the film $64$ and the lower side $61a$ of the mold $61$ so that a vacuum is produced. The relative excess pressure on the oppositely disposed side (lower side in FIG. 6) then presses the sufficiently yielding film $64$ into the convex region. The yielding film $64a$ in the region of the chip $11$ serves for the avoidance of stress peaks at the chip $11$ so that it does not fracture. At the edge $64b$, where the lower side $61a$ of the mold or of the film leaves the upper surface $11o$ of the chip $11$, the film $64$ serves as a seal so that the frame material does not pour out of the cavity $66$ to be filled further over the chip upper surface $11o$ (from $64b$ to the left) on the later molding.

After the pouring in of the frame material and its hardening, the mold $61$ can also be slightly raised upward due to the film $64$. The films does not adhere either to the mold $61$ or to the produced sensor structures and can in turn be easily removed. The dashed line $67$ indicates the ideal, not really present, boundary toward the adjacent sensor element along which then cutting can also take place on separation.

In the marginal region of the chip beyond the cover $16a$, the mold $61$ and then also the film $64$ can project over the chip $11$ in a lateral direction so that a shape for molding the frame $16$ is produced in this manner that, as shown, substantially sets the frame surface to the upper surface $11o$ of the chip $11$. In the edge region $11a$ of the chip $11$, the film $64$ then represents a seal that prevents frame material from running onto the sensitive chip upper surface $11o$.

The radiation permeable layer $17$ is formed after the molding on of the frame $16$. This can be done by pouring a liquid material onto the common surface of a large number of sensor elements produced together before their separation and its uniform distribution and then hardening or by pouring liquid material into tubs produced beforehand as described around the individual sensor chips or by means of a further suitably designed mold.

As already mentioned, the radiation sensor can have further electronic components, optionally as an integrated circuit, that are integrated in the total structure and are in particular also poured into the frame material.

FIG. 7 shows features of the frame design such as can be present in some embodiments in one or more vertical sectional planes of the frame. Qualitatively and quantitatively equivalent conditions can be present over the total periphery of the chip or of the frame.

The dimension br is the above-addressed minimum frame width. The Figure shows a projection $16u$ of the frame $16$ vertically upwardly beyond the plane of the upper surface of the chip $11$ or of the filter layer $12$ whose level is indicated by the dashed line $16n$. The funnel angle T between the straight level lines $16n$ and the straight lines $16t$ between the chip edge $11a$ and the upper outer frame edge $16k$, that can also be the upper outer edge of the radiation sensor $10$, can be below 30° or below 20° or below 15° or below 10° and/or can be above 0° or above 5° or above 10° in the vertical sectional plane. The mentioned funnel angle T can in particular correspond to the angle between the projection $16u$ of the frame $16$ and the radiation permeable layer $17$ in some embodiments. The funnel angle T in the embodiment of FIG. 1 is, in contrast, approximately 0°, that is e.g. in the range between ±3° or ±1°. Unlike as shown in FIGS. 1 and 7, it can also be negative, e.g. up to –10°, so that the frame surface drops toward the outside.

In the embodiment shown, the highest point $16h$ of the frame cross-section is the frame edge $16k$. The cut here can take place along the line $67$ (FIG. 6) during the separation. The highest point $16h$ of the frame in the vertical direction can, however, also be further inwardly disposed, that is displaced to the right with respect to the frame edge $16k$ in FIG. 7. The straight line $16t$ can also extend between the chip edge $11a$ and the possibly inwardly displaced highest point $16b$ of the frame $16$. The funnel angle can then also be dimensioned as described.

In the embodiment shown, the highest point $16h$ of the frame $16$ projects out of the radiation permeable layer $17$ and is no longer covered by it. Contrary to what is shown, it can, however, also be covered by the radiation permeable layer. $16z$ is the side surface or outer side of the frame $16$. It can be created by cutting during the separation of the radiation sensors $10$. The height of the highest point $16h$ above the chip upper surface (line $16n$) can be low in comparison with the maximum extent of the chip. It can be above 3% or above 5% of the maximum extent and can be below 20% or below 15% or below 10%.

The finished sensor element $10$ can have a parallelepiped structure overall and can be an SMD component. The side surfaces can be formed by the lower side of the substrate/lead frame $14$ having externally accessible contact surfaces $15$ embedded or attached to the lower side, by the upwardly disposed radiation permeable layer $17$ opposite it, and possibly by frame regions $16u$, $16h$ projecting beyond them, and by the four sectional surfaces $16z$ on the separation of the sensor elements $10$ produced together. The radiation sensitive side can accordingly be wholly or largely covered by the radiation permeable layer $17$.

Features that are described in this description and in the claims should also be understood as combinable with one another when their combination is not explicitly described as long as the combination is technically possible. Features that are described in a specific context, in an embodiment, in a Figure, or in a claim should also be understood separated from this claim, this Figure, this embodiment, or this context and should be understood as combinable with other Figures, claims, contexts or embodiments as long as the combination is technically possible. Descriptions of methods and method steps should also be understood as descriptions of devices implementing these methods or method steps and vice versa.

REFERENCE NUMERAL LIST 10 radiation sensor
11 chip
11a upper edge, upper peripheral margin
11o chip upper surface
11u chip lower surface
11s chip side surface
12 filter layer
13 adhesive layer
14 substrate
15 contact
16 frame
16a cover
16b recess
16h highest point
16k upper outer edge
16n level straight line
16t straight line
16u projection
16z outer side
17 radiation permeable layer
17a filling
17s lateral overhang
31 bond wire
32 bond pad
33 via
61 mold
61a lower mold surface
62 suction passages
63 vacuum source
64 film
64a film region
64b film region
66 volume
67 boundary

The invention claimed is:

1. A radiation sensor comprising:
a substrate;
a radiation sensitive chip on the substrate that has a plurality of side surfaces and an upper surface and a peripheral upper edge at an upper side;
a radiation impermeable frame joined to the side surfaces of the chip and surrounding the chip; and
a radiation permeable layer over the chip,
wherein the frame does not project over the upper edge of the chip along a substantial part of an inner periphery of the frame; and
the radiation permeable layer projects over the chip in the lateral direction and lies on the frame or above the frame;
further comprising having at least one bond wire that projects laterally from the upper surface of the chip and that is embedded into the frame next to the chip and also above the upper surface of the chip.

2. The radiation sensor in accordance with claim 1, having a filter layer applied to the upper surface of the chip between the upper surface of the chip and the radiation permeable layer.

3. The radiation sensor in accordance with claim 1, wherein the material of the frame is a hardening plastic provided with a filler; and
wherein the material mixture of the frame has a coefficient of expansion that is in the range between 0.3 times and 2 times the coefficient of expansion of the material of a bond wire or of the substrate of the radiation sensor.

4. The radiation sensor in accordance with claim 1, wherein the substantial part of the inner periphery of the frame is at least 30% or at least 50% or at least 70% of a length of the inner periphery of the frame.

5. The radiation sensor in accordance with claim 1, wherein the frame is in a position not substantially lower than the upper edge of the chip, with the position not substantially lower than the upper edge of the chip being a lower position that is at most 10% or at most 5% or at most 2% of the thickness of the chip.

6. The radiation sensor in accordance with claim 1, in which the frame has a projection projecting beyond the upper surface of the chip laterally outside the upper edge.

7. The radiation sensor in accordance with claim 1, in which the maximum extent of the chip in a direction in parallel with the substrate is smaller than 6 mm or smaller than 4 mm or smaller than 2 mm.

8. The radiation sensor in accordance with claim 1, wherein the frame is manufactured using a film assisted molding (FAM) process.

9. The radiation sensor in accordance with claim 1 wherein a portion of the frame that does not substantially project over the upper edge of the chip is a projection that is at most 10% or at most 3% or at most 2% or at most 1% of the maximum extent of the chip in the direction in parallel with the substrate.

10. A radiation sensor comprising:
a substrate;
a radiation sensitive chip on the substrate that has a plurality of side surfaces and an upper surface and a peripheral upper edge at an upper side;
a radiation impermeable frame joined to the side surfaces of the chip and surrounding the chip; and
a radiation permeable layer over the chip,
wherein the frame does not project or does not substantially project over the upper edge of the chip along a substantial part of an inner periphery of the frame;
the radiation permeable layer projects over the chip in the lateral direction and lies on the frame or above the frame, and
at least one bond wire that projects laterally from the upper surface of the chip and that is embedded into the material of the radiation permeable layer above the upper surface of the chip and next to the chip,
wherein the frame has a vertically extending recess through which the bond wire extends toward the substrate, and wherein the bond wire is also embedded into the material of the radiation permeable layer in the recess of the frame.

11. A radiation sensor comprising:
a substrate;
a radiation sensitive chip on the substrate that has a plurality of side surfaces and an upper surface and a peripheral upper edge at an upper side;

at least one bond wire that projects laterally from the upper surface of the radiation sensitive chip and extends downwardly to the substrate;

a radiation impermeable frame surrounding the radiation sensitive chip; and a radiation permeable layer over the radiation sensitive chip, wherein the frame does not project over the upper edge of the radiation sensitive chip except for a region of the at least one bond wire;

wherein the radiation permeable layer projects over the radiation sensitive chip in a lateral direction and lies on the frame or above the frame;

wherein the at least one bond wire is embedded in the frame next to the radiation sensitive chip and also above the upper surface of the radiation sensitive chip, wherein only in the region of the at least one bond wire the frame forms a cover that covers the upper surface of the radiation sensitive chip.

12. A radiation sensor comprising:

a substrate;

a radiation sensitive chip on the substrate that has a plurality of side surfaces and an upper surface and a peripheral upper edge at an upper side;

a radiation impermeable frame surrounding the radiation sensitive chip; and a radiation permeable layer over the radiation sensitive chip;

wherein the frame does not project or does not substantially project over the upper edge of the radiation sensitive chip;

wherein the radiation permeable layer projects over the radiation sensitive chip in a lateral direction and lies on the frame or above the frame;

wherein the radiation sensor has at least one bond wire that projects laterally from the upper surface of the radiation sensitive chip and that is embedded in a material of the radiation permeable layer above the upper surface of the radiation sensitive chip and next to the radiation sensitive chip;

wherein the frame has a vertically extending recess through which the at least one bond wire extends toward the substrate, wherein the bond wire is embedded in the material of the radiation permeable layer also within the recess of the frame.

* * * * *